United States Patent [19]

Baumann

[11] 3,799,535

[45] Mar. 26, 1974

[54] CARRIER BLOCK AND TRAY FOR USE IN ENCAPSULATION OF SEMICONDUCTOR DEVICES

[76] Inventor: Albert C. Baumann, Dallas, Tex.

[22] Filed: Apr. 24, 1972

[21] Appl. No.: 247,063

Related U.S. Application Data

[60] Division of Ser. No. 15,862, March 3, 1970, abandoned, which is a continuation of Ser. No. 562,239, July 1, 1966, abandoned.

[52] U.S. Cl. ................ 269/309, 29/203 P, 269/311

[51] Int. Cl. ................ B23q 3/18

[58] Field of Search ........ 29/203 J, 203 P; 269/287, 269/309, 311

[56] References Cited

UNITED STATES PATENTS

| | | | |
|---|---|---|---|
| 3,114,199 | 12/1963 | Flodberg | 29/203 J |
| 2,835,962 | 5/1958 | Tally et al. | 29/203 P |
| 1,456,506 | 5/1923 | Leveridge | 29/203 J |
| 3,151,387 | 10/1964 | Clemens et al. | 29/203 P |

*Primary Examiner*—Roy Lake
*Assistant Examiner*—E. F. Desmond
*Attorney, Agent, or Firm*—Harold Levine; Andrew M. Hassell; William E. Hiller

[57] ABSTRACT

Disclosed is a process for manufacturing semiconductor devices and the devices produced by the process, wherein a carrier block is employed for supporting lead wires in a fixed position cantilevered outwardly therefrom for assembly with a semiconductor chip, such as a transistor wafer, for subsequent plastic encapsulation thereof with the leads retained by the carrier block being disposed outwardly of the plastic encapsulated semiconductor device upon completion of the process. The carrier block is provided with elongated grooves in a surface thereof for reception of the lead wires and frictional engagement therewith to retain the lead wires in a fixed supported position in the carrier block during the assembly of the semiconductor chip thereto and the subsequent plastic encapsulation procedure. A plurality of such carrier blocks are supported by a tray in side-by-side relationship, the tray including a rib which extends into respective grooves formed in adjacent carrier blocks supported thereby for retaining the carrier blocks in place.

3 Claims, 26 Drawing Figures

CARRIER BLOCK AND TRAY FOR USE IN ENCAPSULATION OF SEMICONDUCTOR DEVICES

This is a division of U.S. application Ser. No. 015,862 filed Mar. 3, 1970, now abandoned, which is a continuation application of parent application Ser. No. 562,239 filed July 1, 1966, now abandoned.

This invention relates generally to the manufacture of semiconductor devices, and more particularly, but not by way of limitation, relates to an improved process for fabricating semiconductor devices, such as transistors, which are encapsulated in a thermosetting plastic by transfer molding, to the equipment for carrying out the process, and to the product of the process.

In general, semiconductor devices are very small and delicate which makes the economical manufacture of high quality devices in a practical and usable form on a mass production basis very difficult. For example, such devices must have electrical leads sufficiently large so that they can be easily soldered or otherwise connected by hand, or by automated equipment, into the final circuit. The devices must be sufficiently rigid to withstand handling, and for many applications must withstand high mechanical shock loads. Further, the components must be packaged so that the leads are electrically isolated. Further, the semiconductor wafers must be protected from some forms of radiant energy, such as light, and heat must be conducted away from the active regions of the device to maintain the device within its safe operating temperature range.

In copending U. S. application Ser. No. 331,006, entitled "Process For Encapsulating Electronic Components In Plastic," filed on Dec. 16, 1963 by Williams et al. and assigned to the assignee of the present application, a process for encapsulating semiconductor devices, particularly delicate planar devices, in a thermosetting plastic using transfer molding techniques is described. In that process, the opposite ends of three parallel lead wires for a transistor are welded to metal tabs to provide a rigid frame. Central portions of the wires are then flattened and a transistor wafer alloyed to one of the flattened portions to both support the wafer and make electrical contact with the collector region. Then very fine gold wires are ball bonded to the emitter and base expanded contact pads on the transistor wafer and to the flattened portions of the other two lead wires. The center portions of this assembly, including the flattened portions of the wires, are then placed in a special transfer mold cavity with the lead wires extending from the opposite ends of the mold cavity. A fluid thermosetting plastic is then introduced through a gate disposed below the wires and therefore below the wafer so that the plastic material will flow into the mold in a direction parallel to the whisker leads to prevent breaking the leads. A number of these assemblies are aligned in a row with the lead wires parallel and are encapsulated simultaneously from a common source of fluid plastic which is supplied through a runner extending transversely of the lead wires. The lead wires extend through the runner so that the plastic in the runner will cure and interconnect all the lead wires of the several assemblies. The metal tabs are then clipped off, thereby electrically isolating the lead wires so that each of the devices can be tested. During testing, the plastic runner conveniently interconnects all of the devices. Then the lead wires are clipped off adjacent to the plastic runner to separate the individual devices. The lead wires then extend from both ends of the encapsulating body and could be sheared off flush with either end of the plastic body and the stub end coated with an insulating material.

The foregoing process permitted, for the first time, the encapsulation of transistor devices in transfer molded thermosetting plastic and resulted in the mass production of high grade transistors at much lower cost than was previously possible. However, the process utilizes only about 18 percent of the plastic and only about 50 percent of the lead wire material and generally requires a relatively large number of process steps.

The present invention is concerned with an improved process for fabricating semiconductor devices that is significantly more economical than previously used processes and which results in improved devices. More particularly, the process of the present invention elimnates all or substantially all waste metal material, decreases the waste plastic from about 82 percent to about 48 percent, and decreases the number and complexity of the process steps. The present process is also aprticularly suited for increased automation. The process is useful in encapsulating substantially any semiconductor device, such as standard planar transistors, diodes, SCR's, etc., as well as field effect transistors, MOS transistors and the like, having any number of leads within reason. The process permits the fabrication of plastic encapsulated transistors in which the leads are arranged in a conventional circle pattern so as to be compatible with printed circuit boards set up to handle transistors packaged in a conventional hermetically sealed header and can assembly. The process also permits the encapsulation of more than one semiconductor device in the same body of plastic, with the semiconductor devices either separate or electrically interconnected.

Another important advantage of the invention is that the lead wires are protected throughout the fabrication process and during testing so that the leads of the final product are perfectly straight.

These and other objects are achieved in accordance with this invention by mounting a plurality of lead wires in a carrier block which frictionally grips the lead wires and holds them in predetermined relationship with the ends of the lead wires cantilevered out from the block. A semiconductor device is then mounted on one of the cantilevered ends, the other ends electrically connected to the semiconductor device, and the ends and device encapsulated. In the fabrication of a transistor, for example, the three wires are disposed in parallel relationship. The cantilevered ends of the lead wires are then flattened to facilitate bonding the semiconductor wafer to one of the lead wires, to facilitate bonding of jumper wires between the wafer and the other leads, and to mechanically secure the wires in the final encapsulation body to increase the mechanical stability of the device. The cantilevered ends of the wires with the semiconductor wafer and whisker wires intact are then encapsulated in plastic, preferably by placing the ends of the wires in a transfer mold cavity and injecting a thermosetting plastic into the mold. The device may be tested while still held in the carrier block, and may then be easily removed from the carrier block. The carrier block can be used repeatedly.

In accordance with a more specific aspect of the invention, the carrier block is comprised of a body of resilient material having a plurality of grooves for frictionally engaging the lead wires after the lead wires have been pressed into the grooves. The grooves may be arranged either in a plane, or when three wires are used for a transistor or the like, the center groove may be raised in order to hold the three lead wires at the desired points on a circle, usually the corners of a right isosceles triangle, so as to position the lead wires in the same pattern as conventionally used for transistor devices encapsulated in a header and can assembly. In accordance with various other aspects of the invention, the carrier blocks are adapted to be placed in side-by-side relationship on a handling tray, and to be easily aligned by indexing pins. The tray is designed so that the carrier blocks can be easily replaced, and are therefore designed so as to be reversible in the trays and thus have a longer useful life. The invention also contemplates a multiple cavity mold and process for simultaneously encapsulating a plurality of the devices in a thermosetting plastic while using a minimum volume of plastic. This is achieved by aligning a plurality of the carrier blocks side-by-side in two rows with the lead wires extending toward the other row into two rows of mold cavities. Plastic is then forced down a single runner between the rows of cavities and through gates into each of the mold cavities to reduce the waste plastic.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

One embodiment of the process of the present invention is illustrated in FIGS. 1–6. A carrier block 10 is used to hold three lead wires 12, 13 and 14 in parallel relationship with the ends of the wires cantilevered out from the carrier block 10. The carrier block 10 is fabricated from a resilient material and is provided with parallel grooves 16, 17 and 18 for receiving the lead wires 12, 13 and 14 in a close interference fit so that the wires will be frictionally retained within the carrier block. This result is achieved by making the width of the grooves 16, 17 and 18 less than the diameter of the lead wires 12–14 and forming the carrier block 10 from a resilient material. The grooves also have a depth greater than the radius of the wires and preferably considerably greater.

The carrier block 10 is typically molded from a granular mixture of 25 percent glass and 75 percent TFE (polytetrafluoroethylene resin), although other materials having similar properties may be used. The TFE-glass mixture can be molded to the necessary tolerances, and is sufficiently resilient to permit the lead wires to be forced into the grooves, yet rigid enough to retain its shape during repeated use. The TFE-glass mixture also will withstand the temperatures encountered in the process steps which will presently be described.

The lead wires 12, 13 and 14 may be identical and are cut to the length required for the final device. The lead wires 12–14 are inserted in the grooves 16–18, respectively, by laying them in the tops of the grooves and then forcing them downwardly into the grooves by a wedge-shaped tool extending substantially the length of the lead wires and having a tip which will also pass into the grooves. Once forced into the grooves, the lead wires are frictionally retained therein against both rotational and longitudinal movement to a sufficient degree to carry out the remaining steps of the process, although both rotational and particularly longitudinal movement can be achieved by applying force.

Figures 1, 2, 3, 4, 5, 6, 7, 8, 9, 10, 11, 12:
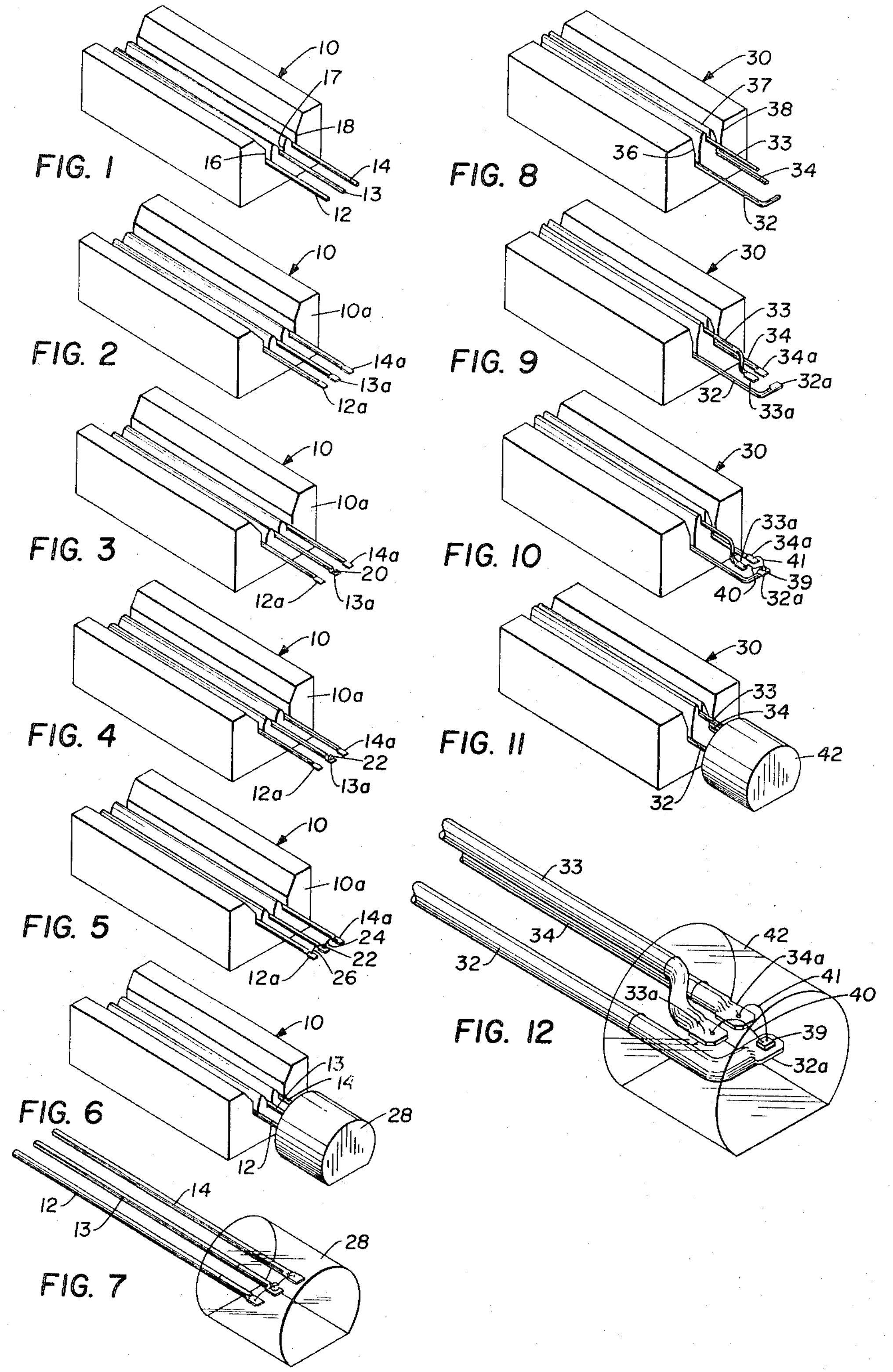
FIGS. 1–6 are perspective views illustrating steps in the fabrication process of the present invention.
FIG. 7 is a perspective view of a transistor fabricated by the process illustrated in FIGS. 1–6.
FIGS. 8–11 are perspective views similar to FIGS. 1–6 which illustrate an alternative embodiment of the process of the present invention.
FIG. 12 is a perspective view of a transistor fabricated by the process illustrated in FIGS. 8–11.

Next, the ends of the wires 12–14 are inserted in a conventional press having dies which flatten the tips *12a*, *13a* and *14a* of the wires substantially as illustrated in FIG. 2. During this step, the ends of the wires may also be aligned at the proper distance from the end *10a* of the carrier block 10 by abutting the carrier block *10a* against a suitable stop while simultaneously abutting the ends of the wires against another appropriately located stop. Next, the ends of the wires are placed on a heater and small square of gold foil 20 placed on the flat end *13a* of the center lead wire 13. The gold foil then melts and adheres to the lead. Next, a semiconductor wafer 22 containing a device, for example, a transistor is placed on the gold foil and the lead wires heated so that the wafer is alloyed to the flattened portion *13a* of the center lead 13 by the gold. In a transistor, this procedure usually connects the collector to the lead wire. A small diameter, gold whisker wire lead 24 is then bonded to the expanded base contact on the wafer 22 and the flattened end *14a*, and a lead 26 bonded to the expanded emitter contact and to flattened end *12a*.

Next, the cantilevered ends of the leads 12–14, together with the transistor wafer 22 and jumper wires 24 and 26, are placed in a suitable transfer mold cavity and the ends of the lead wires 12–14 encapsulated by a body of plastic 28 as shown in FIG. 6. After the device is removed from the mold, it can be tested, while still in the carrier block 10, by probes applied to the leads 12–14 because the carrier block 10 is an electrical insulator. The device may then be easily removed from the carrier block 10 by pulling on the plastic body 28 so as to move the leads longitudinally from the grooves 16–18. The finished device may appear substantially as illustrated in FIG. 7, although the plastic material is opaque, not transparent as illustrated.

It will be noted that the lead wires 12–14 do not need to be trimmed at any stage of the process, so that no lead wire material is wasted, and there are no lead wires which must be sheared off at the plastic body and then coated with an insulator. The lead wires are securely anchored within the plastic capsule by reason of the flattened ends 12*a*–14*a* and cannot be rotated or pulled from the encapsulating body of plastic. Further, the ends of the lead wires are spaced a substantial distance from the adjacent boundary of the encapsulating plastic and therefore are well insulated and protected from the ambient.

A process for fabricating a transistor in which the leads are oriented in the circle pattern conventionally used for hermetically sealed packages consisting of a metal header and a metal can is illustrated in FIGS. 8–11. In this process, a carrier block 30 is used to support lead wires 32–34 in parallel cantilevered fashion in parallel grooves 36–38 as heretofore described. The carrier block 30 may be molded from the same material as the carrier glock 10 and the lead wires 32–34 retained by a friction fit in the grooves 36–38 as heretofore described. However, the bottom of the center groove 37 is disposed at a substantial height above the bottom of the two outer grooves 36 and 38 so that leads located in the bottoms of the grooves are oriented at the desired locations, which is essentially the apexes of a right isosceles triangle.

The lead wires 33 and 34 may be of identical length and initially be perfectly straight so as to reduce inventory problems. Lead wire 32 is, however, preferably slightly longer than lead wires 33 and 34. When the lead wires are loaded in the grooves as heretofore described, the end of the lead wire 32 is projected out further than the ends of the lead wires 33 and 34, and then is bent at a right angle in a horizontal plane, substantially as illustrated in FIG. 8. Next, the ends of the three lead wires 32–34 are subjected to a press having a die which bends the end of the center lead wire 33 down to the same plane as leads 32 and 34 and simultaneously flattens the ends 32*a*–34*a* preparatory to receiving a transistor wafer and the very fine whisker wires. Any other required lead positioning or shape can be accommodated so long as a mold parting line can be established, as well as different numbers of lead wires. A transistor wafer 39 is then alloyed to the flattened end 32*a* using gold foil as heretofore described, and whisker wires 40 connected between the expanded base contact of the transistor wafer and the flattened end 33*a*, and wire 41 is connected between the expanded emitter contact of the transistor wafer and the flattened end 34*a* substantially as shown in FIG. 10. The cantilevered ends of the lead wires 32–34 are then inserted in a transfer mold and the ends of the lead wires, the transistor wafer and the lead wires 39 40 and 41 encapsulated in a plastic body 42 substantially as shown in FIG. 11. The transistor may then be tested while still in the carrier block 30, and when the test is completed, may be removed from the carrier block 30 by pulling on the body 42 so as to move the lead wires longitudinally from the grooves 36–38. The resulting transistor is illustrated in FIG. 12, although again the plastic body 42 is opaque rather than clear as shown in the drawing.

Figure 13:
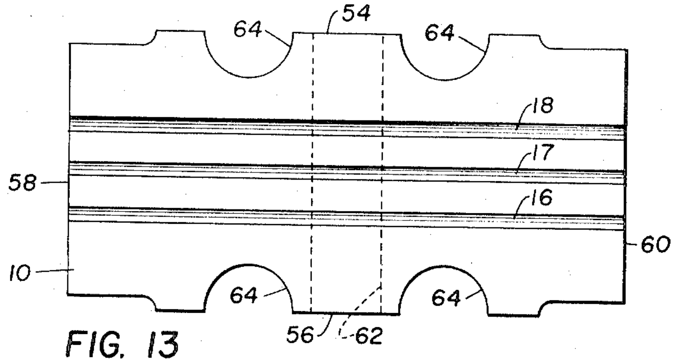
FIG. 13 is a plan view of a preferred embodiment of the carrier block used in the process illustrated in FIGS. 1–6.
Figure 15:
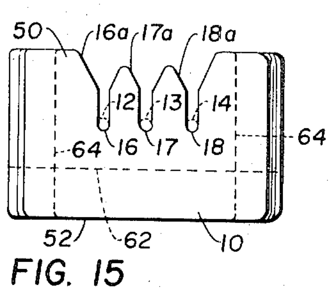
FIG. 15 is an end view of the carrier block of FIG. 13.
Figure 14:
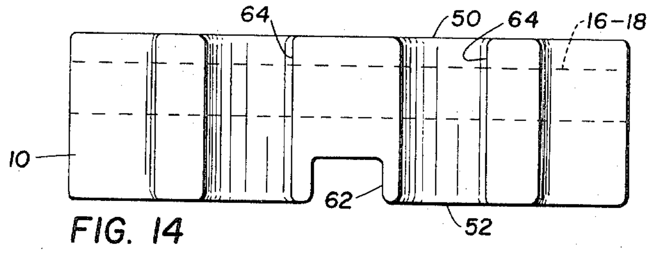
FIG. 14 is a side view of the carrier block of FIG. 13.

In accordance with a more specific aspect of the invention, each of the carrier blocks 10 is fabricated as illustrated in FIGS. 13–15. The carrier block 10 is generally rectangular in shape and has generally flat upper and lower surfaces 50 and 52 (FIGS. 14 and 15), generally flat side surfaces 54 and 56 (FIG. 13), and generally flat end surfaces 58 and 60 (FIG. 13). A retaining groove 62 is formed in the lower face 52 and extends transversely of the carrier block 10, which is preferably symmetrical about the channel 62 so as to prolong the useful life of the block. The grooves 16–18 are formed in the upper surface 50 and extend parallel over the entire length of the block between both end surfaces 58 and 60 and opening onto said end surfaces 59 and 60. It will be noted that the bottoms of the grooves are oriented in a plane. Two alignment grooves 64 are formed in each of the side surfaces 54 and 56, one on each side of the retainer groove 62, and extend upwardly from the bottom surface 52, preferably to the top surface 50. The alignment grooves 64 are generally semicircular in cross seciton, but are slightly less than semicircular, so that an alignment pin forced between two adjacent blocks will separate the blocks slightly.

As can be seen in FIG. 15, each of the grooves 16–18 is enlarged at the upper ends 16*a*–18*a*, respectively, to facilitate forcing the lead wires 12–14 into the respective grooves. The lower portions of the grooves 16–18 preferably have parallel sides which are spaced apart a distance less than the diameter of the leads 12–14 so that the leads will be retained in the grooves by a tight friction fit.

Figure 16:
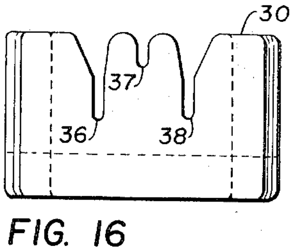
FIG. 16 is an end view of a preferred embodiment of the carrier block used in the process of FIGS. 8–11.

The carrier block 30 used in the process illustrated in FIGS. 8–11 may have the identical plan view and side view illustrated in FIGS. 13 and 14, but an end view as illustrated in FIG. 16. It will be noted from FIG. 16 that the center groove 37 is oriented at a higher position than the two outer grooves 36 and 38, as previously described in connection with the process of FIGS. 8–11.

Figure 19:
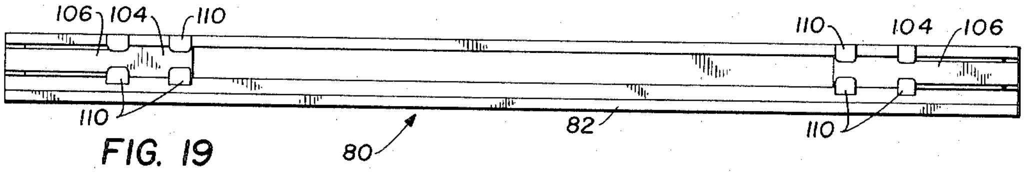
FIG. 19 is a rear view of the tray illustrated in FIG. 17.
Figure 17:
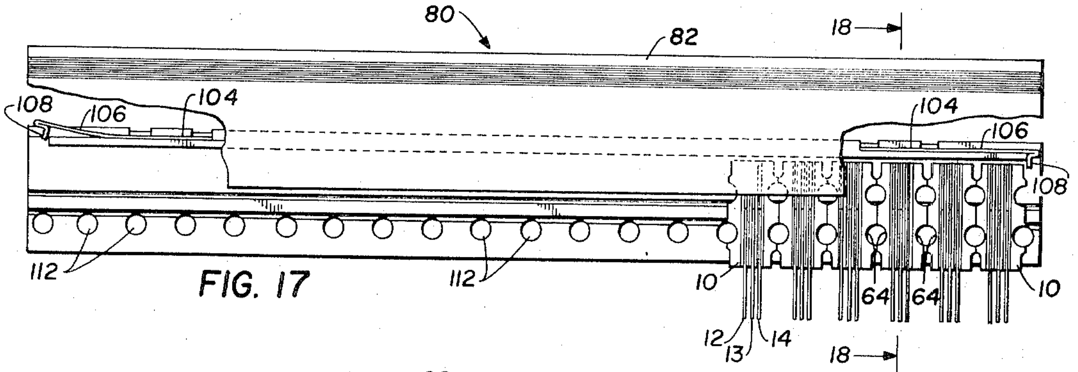
FIG. 17 is a plan view, partially broken away to reveal details of construction, of a tray for a plurality of the carrier blocks illustrated in FIGS. 13–15.
Figure 18:
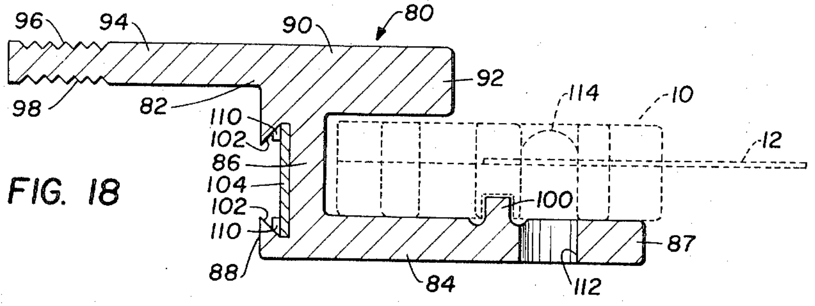
FIG. 18 is a sectional view taken substantially on lines 18—18 of FIG. 17.

A tray constructed in accordance with the present invention for carrying twenty of the carrier blocks 10 is indicated generally by the reference numeral 80 in FIGS. 17–19. The tray 80 is comprised essentially of a length of aluminum extrusion 82 having a cross-sectional configuration substantially as illustrated in FIG. 18. The extrusion 82 has a base plate 84 having front and rear edges 87 and 88, an upper plate 90 which is connected to a web 86 extending upwardly from the base plate 84 adjacent to the rear edge 88. The upper plate 90 has a forwardly extending portion 92 which extends over a portion of the base plate 84, and a rearwardly extending portion 94 which may be provided with serrations 96 and 98 on the upper and lower surfaces to facilitate grasping the flange with the fingers.

The base plate 84 has a retainer rib 100 extending longitudinally of the flange which is adapted to be received in the retainer groove 62 of the carrier blocks 10 illustrated in dotted outline in FIG. 18, or of course carrier blocks 30. The web 86 is located sufficiently rearwardly of the rib 100 as to clear the rear end of the carrier blocks 10, and the forwardly extending flange portion 92 of the upper plate extends over the end of the carrier block 10 so as to retain the carrier blocks 10 in position on the rib 100. The rib 100 and the location of the flange 92 and the web portion 86 are such as to permit very free sliding and a wobbling movement of the carrier blocks 10.

The web portion 86 includes a dovetailed channel 102 which is adapted to closely receive the enlarged root sections 104 of a pair of leaf springs 106 (FIG. 17). The remainder of the leaf springs 106 are sufficiently narrow to freely pass from the dovetailed groove 102. The ends of the springs 106, as best seen in FIG. 17, provide tips 108 which project beyond the forward face of the web section 86 and engage the rear ends of the carrier blocks 10 to prevent the carrier blocks from sliding out the ends of the retaining chamber formed by rib 100, base plate 84 and top plate 92. The root sections 104 are retained in the dovetail grooves by the stakes 110. When the spring 106 is pulled back as illustrated at the left hand end of the tray 80 in FIG. 17, the carrier blocks 10 can be loaded into or emptied from the tray.

When 20 carrier blocks are positioned between the tips 108 of the two springs 106 in the tray illustrated, there is still a slight spacing between each adjacent pair of carrier blocks 10. 21 guide holes 112 are drilled at equally spaced positions through the base plate 84 forward of the rib 100 at intervals to be aligned with the bores formed by the alignment grooves 64 between each adjacent pair of carrier blocks 10. As mentioned, each of the alignment grooves 64 is slightly less than a full semicircle, but has the same radius of curvature as the holes 112. At each station where an operation is to be performed on the ends of the lead wires 12–14, alignment pins 114 (FIG. 18) are passed through one or more of the guide holes 112 and between the adjacent pairs of carrier blocks 10. When a pin 114 is inserted through each hole 112, each of the carrier blocks is precisely located and all looseness of the carrier blocks is substantially eliminated. This permits precision operations to be carried out on the cantilevered ends of the leads 12–14 which are then located at precisely predetermined positions. Varying degrees of alignment can also be obtained by eliminating certain of the pins 114 where some movement of the cantilevered leads is desired.

In the process illustrated in FIGS. 1–5, the tray 80 is customarily placed on a series of 21 pins so that the ends of each set of lead wires will be precisely oriented with respect to that station and will be held very steady. In carrying out the step illustrated in FIG. 1, the leads 12–14 are customarily loaded into all of the carrier blocks 10 at the same time using a single vacuum pickup head. Then the tray is inserted in a press, using all of the guide pins, and all of the leads simultaneously forced into the bottoms of the respective grooves 16–18. The tray 80 is then moved to a press where it is positioned on a new set of guide pins and the flattened ends 12a–14a of the leads of all 20 carrier blocks simultaneously formed. The square of gold foil 20 is then placed on the flattened ends 13a, one at a time, by hand. Generally no indexing is required for this step, although the cantilevered ends of the leads are placed on a heated surface to melt the gold foil 20. Next, the tray 80 is placed on a machine having an indexing carriage with alignment pins for each of the holes 112, and the carrier blocks are successively indexed past a heating station, including microscope, where the semiconductor wafers 22 are successively placed on the spots of gold metal 20 by hand or other means, and the wafers 22 alloyed to the flattened ends 13a. Next, the tray 80 is placed on the indexing carriage of a ball bonding machine, which may also include all 21 guide pins, and the carrier blocks successively indexed past the ball bonding station so that the whisker wire leads 24 and 26 may be bonded in position. Finally, the trays 80 and the 20 carrier blocks are taken to a transfer mold which will now be described.

Figures 20, 21, 22, 23, 24, 25, 26:
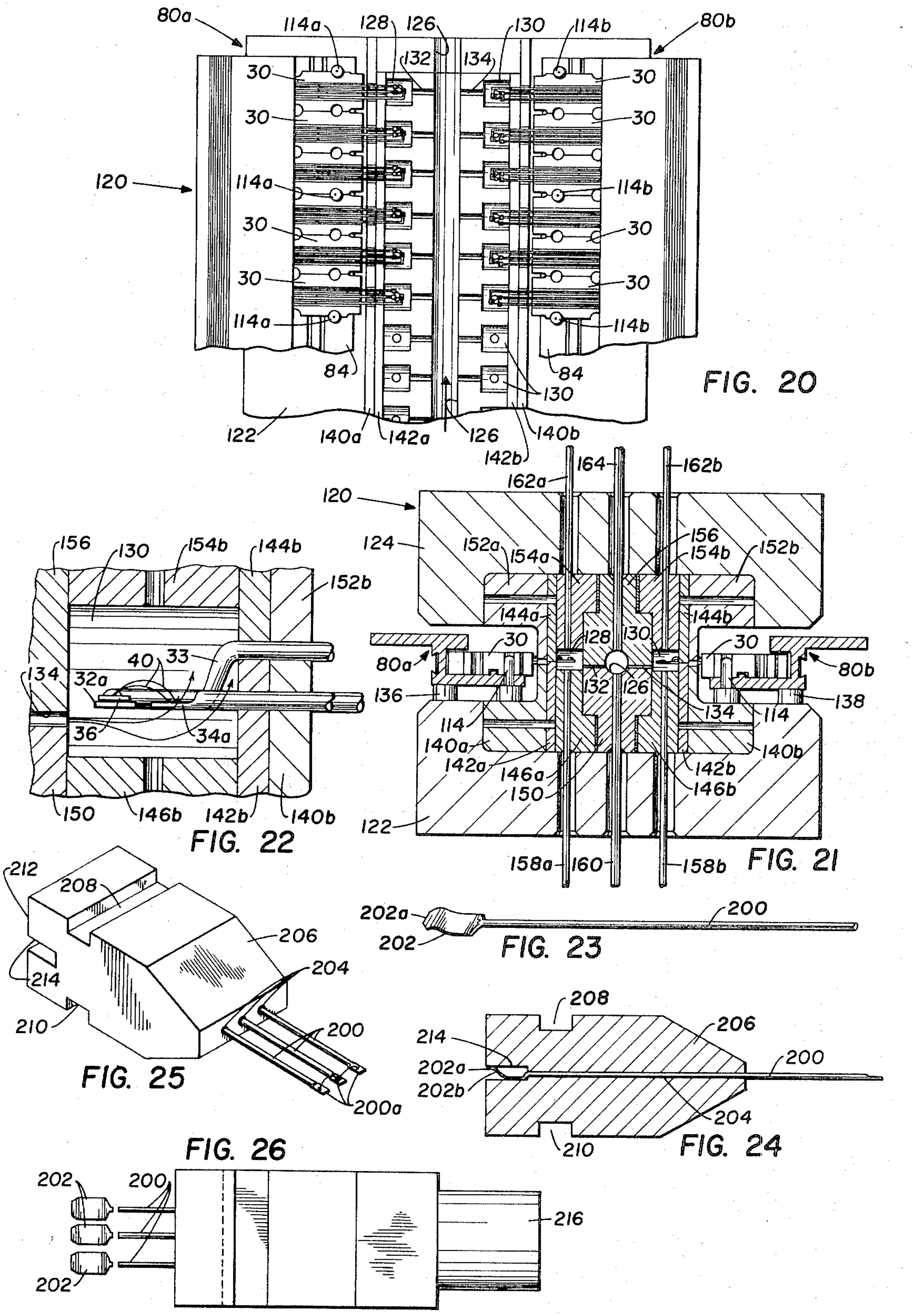
FIG. 20 is a plan view of the lower half of a multiple cavity mold constructed in accordance with this invention for carrying out the process of the present invention.
FIG. 21 is a sectional view through both the bottom and top halves of the mold illustrated in FIG. 20.
FIG. 22 is an enlarged sectional view of an individual cavity of the mold of FIG. 20.
FIGS. 23–26 are simplified drawings illustrating still another embodiment of the process of the present invention.

A transfer molding apparatus for carrying out the process of the present invention is indicated generally by the reference numeral 120 in FIGS. 20 and 21. The molding apparatus is comprised of a lower mold half, indicated generally by the reference numeral 122, and an upper mold half, indicated generally by the refernece numeral 124. The lower mold half 122 is shown in plan view in FIG. 20 and includes the lower half of a single channel or runner 126 which supplies fluid plastic to a row of individual mold cavities 128 on one side, and a row of individual mold cavities 130 on the other side through gates 132 and 134, respectively. The lower mold half 122 includes support means for supporting a pair of trays 80a and 80b at the proper position so that the ends of the wires 32–34 carried by each of the twenty carrier blocks 30 in the tray will be positioned over the cavities 128 and 130, respectively. For example, the front edges of each of the trays is conveniently supported by a series of pedestals threaded into the body of the lower mold half which have smaller alignment pins 114a and 114b located to extend through every fourth alignment hole 112 of the respective trays 80a and 80b. The rear edges of the trays are supported by the heads of screws 136 and 138, as best seen in FIG. 21.

The lower mold half 122 includes guide inserts 140a and 140b which contain a series of V slots for receiving and precisely positioning each of the lead wires extending from each of the carrier blocks 30 in the appropriate semicircular slots formed in the edges of sealing inserts 142a and 142b. The sealing inserts 142a and 142b mate with similar sealing inserts 144a and 144b in the upper mold half 124 to form a seal around each of the lead wires and form th ends of the mold cavities. It will be noted that when alignment pins 114a and 114b are positioned only in every fourth hole, there remains some play between the carrier blocks 30 so as to permit the V-grooves of the guide inserts 140a and 140b to precisely position the wires in the proper slots of the sealing inserts 142a and 142b. The side walls of the cavities 128 and 130 are formed by inserts 146a and 146b, and the other end walls of the cavities, the lower half of the runner channel 126 and the lower halves of the gates 132 and 134 are formed by a center insert 150. The upper mold half 124 also has guide inserts 152a and 152b which mate with inserts 140a and 140b, the sealing inserts 144a and 144b previously mentioned which mate with the sealing inserts 142a and 142b, inserts 154a and 154b which form the upper halves of the side walls of the individual mold cavities 128 and 130, and an insert 156 which forms the upper half of the runner channel 126 and the gates 132 and 134.

Rods 158a and 158b extend upwardly through the lower mold half 122 into the cavities 128 and 130, respectively, and rod 160 extends into the runner channel 126 to force the molded bodies from the lower mold half, and rods **162*a* and 162*b* extend downwardly through the upper mold half 124 to the cavities 128 and 130, and rod 164 extends downwardly to the runner channel 126** to force the molded parts from the upper mold half.

The fluid plastic material is introduced to each of the individual mold cavities in accordance with the process described and claimed in the above-referenced co-pending application, substantially as illustrated in FIG. 22. Thus, the gate 134 is positioned below the ends of the lead wires and is directed substantially parallel to the whisker wires 40 and 41 so that the whisker wires will not be broken by the relatively high velocity incoming fluid. In this connection, when encapsulating the devices illustrated in FIG. 5, the gates are oriented at the sides of the individual cavities, rather than at the ends as illustrated in FIG. 20, so that the fluid plastic will still be introduced parallel to the very fine whisker wires 24 and 26.

Thus, in the operation of the molding apparatus 120, two trays 80a and 80b, each loaded with 20 carrier blocks 30 which each carry a transistor at the stage of fabrication illustrated in FIG. 10, are placed over the alignment pins **114*a* and 114*b* on the lower mold half 122. The V-grooves in the alignment inserts 140*a* and 140*b* precisely position each lead wire in the appropriate groove formed in the sealing inserts 142*a* and 142*b*. The mold halves are continuously heated to the necessary curing temperature for the plastic. Then the upper mold half 124 is lowered to seal the individual cavities 128 and 130. Hot thermosetting plastic is then forced under pressure, at relatively high velocity, through the channel 126. The fluid plastic flows to the end of the channel 126 and then sequentially fills the cavities 128 and 130. The cavities are filled in less than 15 seconds, then allowed to cure for about 30 seconds to insure that the plastic is hardened. The individual cavities 128 and 130, the gates 132 and 134 and the runner channel 126** are then all filled with cured plastic.

As the upper mold 124 is raised, rods **162*a*, 162*b* and 164 remain in position so as to push the molded bodies from the upper mold half. Additional lift rods simultaneously raise the trays and the blocks contained therein to prevent bending the leads during ejection from mold cavities. After the upper mold half 124 has cleared, rods 158*a*, 158*b* and 160 then punch the molded boides from the lower mold half 122. At this time, the individual transistors may be readily separated from the gates 132 and 134 without removing them from the carrier blocks 30**, and the individual transistors may be electrically tested prior to removal from the carrier blocks as previously mentioned.

Another embodiment of the process of the present invention is illustrated in FIGS. 23–26. In this process, the lead wires 200 are cut to the proper lengths and one end deformed to form a locking key. For example, the end may be flattened by the same shear that cuts the wires into the desired lengths so as to form a spring 202 having first and second portions **202*a* and 202*b* which extend beyond the diameter of the wire 200 as can best be seen in FIG. 24. Three of the wires are then inserted through bores 204 in a carrier block 206**.

The carrier block 206 has grooves 208 and 210 in the top and bottom surfaces which may be used to secure the carrier block in a tray similar to the tray 80. However, such a tray would leave the rear end 212 of the carrier block 206 open so that the lead wires 200 could be inserted into the bores 204 from the rear surface. A groove 214 is formed in the rear surface 212 and intersects the bores 204. The walls of the groove 214 are dimensioned so that the projections **202*a* and 202*b* of the spring section 202 will engage the walls of the groove 214 and frictionally secure the lead wire 200** in place within the bore through the carrier block, and prevent rotation of the wire.

The ends **200*a* of the lead wires 200 are then processed by flattening, alloying the wafer to one lead and interconnecting the other leads and the wafer, and encapsulating as heretofore described in connection with FIGS. 1–6, or FIGS. 8–11. The solid plastic body 216 may then be pushed back against the front end of the carrier block 206 so as to push the key sections 202 from the groove 214, substantially as illustrated in FIG. 26. The key sections 202 may then be clipped from the lead wires 200** to remove the completed transistor from the carrier block. This process has the disadvantage of resulting in the loss of a small amount of the lead wires.

From the above detailed description of preferred embodiments of the invention, it will be noted that an improved process for fabricating plastic encapsulated transistors and other semiconductor devices has been described, together with certain novel apparatus for carrying out the process, and a novel product. In the preferred forms of the process, 100 percent of the lead wire material is utilized. Further, a much higher percentage of the plastic is utilized, typically 52 percent as compared with about 18 percent, because of the fact that a single runner 126 supplies plastic to at least twice as many cavities 128 and 130. The wires are no longer welded to tabs, and the excess lead wires need not be clipped off at the plastic body and coated with an insulating material. The individual carrier blocks may be used repeatedly, and are inititally fairly inexpensive since they can be molded from plastic. The final transistor is superior because the ends of the lead wires are not near the surface of the plastic encapsulation material and because the lead wires are protected throughout the processing by the carrier blocks and are therefore perfectly straight.

Although the embodiment of the invention herein described relates to the fabrication of transistors, it is to be understood that the process is also applicable to the fabrication of many other types of semiconductor devices having a fewer or greater number of leads. When utilizing a greater number of leads, the leads may be disposed at angles so as to converge at a central point, and one or more devices may be connected to one or more leads and to the various leads. Then all of the devices and leads may be encapsulated in a common body of plastic.

Although preferred embodiments of the invention have been described in detail, it is to be understood that various changes, substitutions and alterations can be made therein without departing from the spirit and scope of the invention as defined by the appended claims.

What is claimed is:

1. A tray for holding a plurality of generally rectangular carrier blocks each having top and bottom surfaces, opposite side surfaces and front and rear end surfaces with a plurality of grooves formed in the top surface and extending to the front end surface, a transverse groove in at least one of the top and bottom surfaces extending between the side surfaces, and an alignment groove formed in each of the side surfaces and extending to the bottom surface, the alignment grooves being disposed one opposite the other, the tray comprising an elongated body having a substantially uniform cross section characterized by a base plate for supporting the carrier blocks in side-by-side relationship extending transversely of the elongated body, a top plate extending over a portion of the top surfaces adjacent the rear end surfaces but leaving the grooves in the top surfaces exposed adjacent the front end surfaces, means extending by the rear end surface and connecting the top plate to the base plate, a rib formed on at least one of the base or top plates and adapted to enter the respective transverse grooves and retain the carrier blocks between the plates, means at each end of the tray for retaining the carrier blocks on the rib, and a plurality of alignment holes in the base plate positioned to receive alignment pins projecting upwardly through the alignment holes into the alignment grooves between adjacent pairs of carrier blocks.

2. A carrier block for holding a plurality of lead wires during the fabrication of a semiconductor device on the lead wires, said carrier block comprising: a generally rectangular body of resilient material having generally parallel top and bottom surfaces, generally parallel side surfaces, and generally parallel end surfaces, said body being provided with a plurality of grooves formed in the top surface thereof and open at both end surfaces, each of said grooves having a depth greater than one-half the diameter of the lead wire to be retained therein and a width less than the diameter of the lead wire, whereby a lead wire can be pressed into each of the grooves and frictionally retained in the respective grooves with the ends of the lead wires cantilevered out from the carrier block, and said body being provided with a further groove extending transversely across at least one of the top and bottom surfaces for mounting the carrier block in a tray.

3. A carrier block for holding a plurality of lead wires during the fabrication of a semiconductor device on the lead wires, said carrier block comprising: a generally rectangular body of resilient material having generally parallel top and bottom surfaces, generally parallel side surfaces, and generally parallel end surfaces, said body being provided with a plurality of grooves formed in the top surface thereof and open at both end surfaces, each of said grooves having a depth greater than one-half the diameter of the lead wire to be retained therein and a width less than the diameter of the lead wire, whereby a lead wire can be pressed into each of the grooves and frictionally retained in the respective grooves with the ends of the lead wires cantilevered out from the carrier block, and said body being provided with an alignment groove in each of the side surfaces thereof extending to the bottom surface, the alignment grooves in the two side surfaces being aligned such that the alignment grooves of two carrier blocks disposed in side-by-side relationship will form a single passageway for receiving a common alignment pin.

* * * * *